US008228714B2

(12) United States Patent
Davierwalla et al.

(10) Patent No.: US 8,228,714 B2
(45) Date of Patent: Jul. 24, 2012

(54) MEMORY DEVICE FOR RESISTANCE-BASED MEMORY APPLICATIONS

(75) Inventors: Anosh B. Davierwalla, San Diego, CA (US); Cheng Zhong, San Diego, CA (US); Dongkyu Park, San Diego, CA (US); Mohamed Hassan Abu-Rahma, San Diego, CA (US); Mehdi Hamidi Sani, Rancho Santa Fe, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 988 days.

(21) Appl. No.: 12/206,933

(22) Filed: Sep. 9, 2008

(65) Prior Publication Data

US 2010/0061144 A1 Mar. 11, 2010

(51) Int. Cl.
*G11C 11/00* (2006.01)
(52) U.S. Cl. ............ 365/158; 365/148; 365/189.11
(58) Field of Classification Search ............ 365/148, 365/158, 163, 171, 173, 189.011; 257/E21.665
See application file for complete search history.

(56) References Cited

U.S. PATENT DOCUMENTS

| | | | |
|---|---|---|---|
| 6,885,579 B2 * | 4/2005 | Sakimura et al. | 365/158 |
| 7,206,216 B2 * | 4/2007 | Osada et al. | 365/148 |
| 7,236,418 B2 * | 6/2007 | Uvieghara | 365/225.7 |
| 7,272,035 B1 | 9/2007 | Chen et al. | |
| 7,453,719 B2 * | 11/2008 | Sakimura et al. | 365/158 |
| 7,529,124 B2 * | 5/2009 | Cho et al. | 365/163 |
| 7,738,306 B2 * | 6/2010 | Shiah | 365/189.16 |
| 2004/0057281 A1 * | 3/2004 | Ooishi | 365/173 |
| 2004/0125682 A1 | 7/2004 | Takashima | |
| 2007/0159894 A1 * | 7/2007 | Huber et al. | 365/189.01 |
| 2008/0137430 A1 | 6/2008 | Lasseuguette | |
| 2011/0176350 A1 * | 7/2011 | Jung et al. | 365/148 |

OTHER PUBLICATIONS

International Search Report—PCT/US2009/055617, International Search Authority—European Patent Office Nov. 16, 2009.
Written Opinion—PCT/US2009/055617, International Search Authority—European Patent Office Nov. 16, 2009.

* cited by examiner

*Primary Examiner* — Tuan T Nguyen
*Assistant Examiner* — Lance Reidlinger
(74) *Attorney, Agent, or Firm* — Sam Talpalatsky; Nicholas J. Pauley; Jonathan T. Velasco

(57) ABSTRACT

In a particular embodiment, a memory device is disclosed that includes a memory cell including a resistance-based memory element coupled to an access transistor. The access transistor has a first oxide thickness to enable operation of the memory cell at an operating voltage. The memory device also includes a first amplifier configured to couple the memory cell to a supply voltage that is greater than a voltage limit to generate a data signal based on a current through the memory cell. The first amplifier includes a clamp transistor that has a second oxide thickness that is greater than the first oxide thickness. The clamp transistor is configured to prevent the operating voltage at the memory cell from exceeding the voltage limit.

7 Claims, 4 Drawing Sheets

MEMORY DEVICE FOR RESISTANCE-BASED MEMORY APPLICATIONS

I. FIELD OF THE DISCLOSURE

The present disclosure is generally directed to a memory device including an amplifier and a memory cell including a resistance-based memory element.

II. BACKGROUND

Advances in non-volatile memory technology include resistance-based memory technologies, such as Magnetic Random Access Memory (MRAM). MRAM technology is an emerging non-volatile memory technology that employs ferromagnetic-based Magnetic Tunnel Junctions (MTJs) as the basic memory elements.

A commonly used array architecture for MRAMs is the one-transistor, one-MTJ (1T1MTJ) architecture. As the name suggests, each bit cell in this architecture consists of an MTJ connected in series with an NMOS access transistor. In order to leverage the increased density and area reduction advantages associated with scaling down MOS technologies, it is desirable to use core transistors within the MRAM bit cell. However, while scaling down MOS technology into the deep submicron regime yields area and density benefits to the MRAM bit cells, using these deep submicron devices in the MRAM sense amplifier degrades the read performance (the output swing) of the MRAM sense amplifier due to operating voltage limitations of these deep submicron devices.

Conventional MRAM sense amplifier designs for the 1T1MTJ architecture use core transistors. However, due to breakdown and reliability considerations, the supply voltage for the core transistors is typically limited to about 1 volt (V) for leading-edge deep submicron technologies. The following devices are stacked between the supply rails in conventional MRAM sense amplifier designs for the 1T1MTJ architecture: the bit cell comprising an access transistor and an MTJ device, a mux transistor, a clamp transistor, and a PMOS load transistor. The access and mux transistors should be operated as switches (in the linear region), while the clamp and PMOS load transistors should remain in saturation for the sense amplifier to exhibit reasonable gain. However, the low supply voltage requirement that comes from using core devices in the sense amplifier coupled with the transistor threshold voltage being a significant fraction of this supply voltage can make it difficult to keep the clamp and PMOS load transistors in saturation, which in turn, degrades the gain and results in a sub-optimal signal swing at the sense amplifier output.

III. SUMMARY

In a particular embodiment, a memory device is disclosed that includes a memory cell including a resistance-based memory element coupled to an access transistor. The access transistor has a first oxide thickness to enable operation of the memory cell at an operating voltage. The memory device also includes a first amplifier configured to couple the memory cell to a supply voltage that is greater than a voltage limit to generate a data signal based on a current through the memory cell. The first amplifier includes a clamp transistor that has a second oxide thickness that is greater than the first oxide thickness. The clamp transistor is configured to prevent the operating voltage at the memory cell from exceeding the voltage limit.

In another embodiment, a memory device is disclosed that includes a data read path including a first load device coupled to a data storage cell via a first clamp transistor. The first load device has a first device configuration to operate at a first supply voltage. The data storage cell includes an access transistor having a second device configuration to operate at a voltage not to exceed a voltage limit that is less than the first supply voltage. A control terminal of the clamp transistor is biased to prevent the voltage at the data storage cell from exceeding the voltage limit.

In another embodiment, a method is disclosed that includes coupling a first amplifier stage to a memory array. The first amplifier stage includes transistors having an input-output (IO) supply voltage tolerance. The memory array including transistors having a core supply voltage tolerance that is less than the IO supply voltage tolerance. The method includes applying a control voltage at a clamp transistor coupled to the memory array to set a memory array voltage, such that the memory array voltage is less than the core supply voltage tolerance.

One particular advantage provided by the disclosed embodiments is an improvement in the read performance of the MRAM sense amplifier because the higher supply voltage enables a greater output swing to distinguish logical values during read operations.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
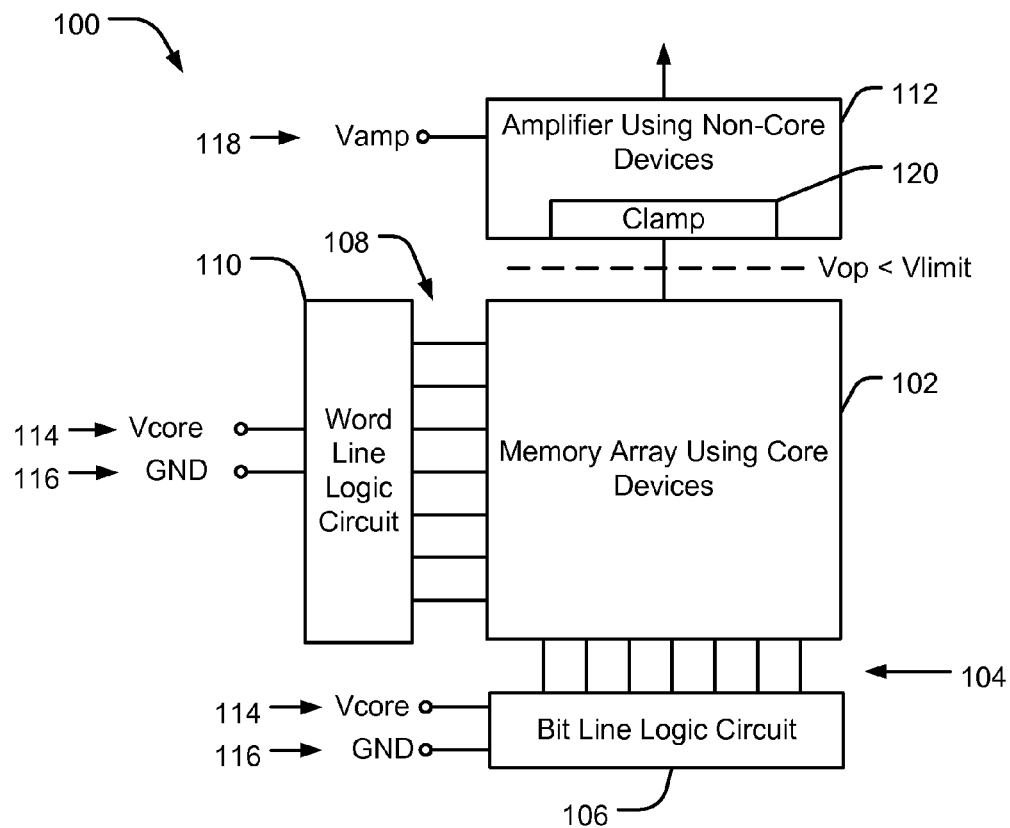
FIG. 1 is a diagram of a particular illustrative embodiment of a memory device with an amplifier using a first type of device and a memory array using a second type of device.

Referring to FIG. 1, a diagram of a particular illustrative embodiment of a memory device with an amplifier using a first type of device and a memory array using a second type of device is depicted and generally designated 100. The memory device 100 may include a memory array 102 using core devices. In a particular embodiment, the core devices may operate at core supply voltages Vcore of up to about 1 volt (V). The memory array 102 may be coupled by bit lines 104 to a bit line logic circuit 106. The memory array 102 may be coupled by word lines 108 to a word line logic circuit 110. The bit line logic circuit 106 and the word line logic circuit 110 may be coupled to a core supply voltage Vcore, as indicated at 114, and to ground, as indicated at 116. The memory array 102 may also be coupled to an amplifier 112 that uses non-core devices. In a particular embodiment, the non-core devices may operate at input-output (IO) supply voltages Vamp of up to about 1.8V. The amplifier 112 may be coupled to an IO supply voltage Vamp, as indicated at 118. The amplifier 112 may include a clamp 120 coupled to the memory array 102 to keep an operating voltage Vop supplied to the memory array 102 by the amplifier 112 below a voltage limit Vlimit.

By employing a higher supply voltage Vamp and high-voltage-tolerant input-output (IO) devices for transistors in the sense amplifier 112 while continuing to use area-efficient core devices in the memory array 102, for example, for MRAM bit cell transistors, such as access transistors and MUX transistors, read performance may be improved while maintaining a high array density. Since high-voltage-tolerant IO devices use a thicker gate oxide, their minimum feature size is also higher than that of core devices, which implies a higher area impact. As illustrated, the system 100 provides an improvement in the read performance (the output swing) of the MRAM sense amplifier 112 without much of an area penalty for the complete memory device 100 because (1) the higher supply voltage results in a greater output swing, thus, considerably improving the read performance, and (2) high-voltage-tolerant IO devices may be used only in the sense amplifier 112, while the MRAM bit cells that constitute a much larger portion of the memory device 100 area use high-density core devices. Since the number of sense amplifiers 112 on a memory chip is far less than the number of bit cells, the area penalty that comes from using high-voltage-tolerant IO devices for the clamp and PMOS load transistors in the sense amplifier 112 may be minor compared to the significantly improved read performance that is associated with the use of the higher supply voltage.

Figure 2:
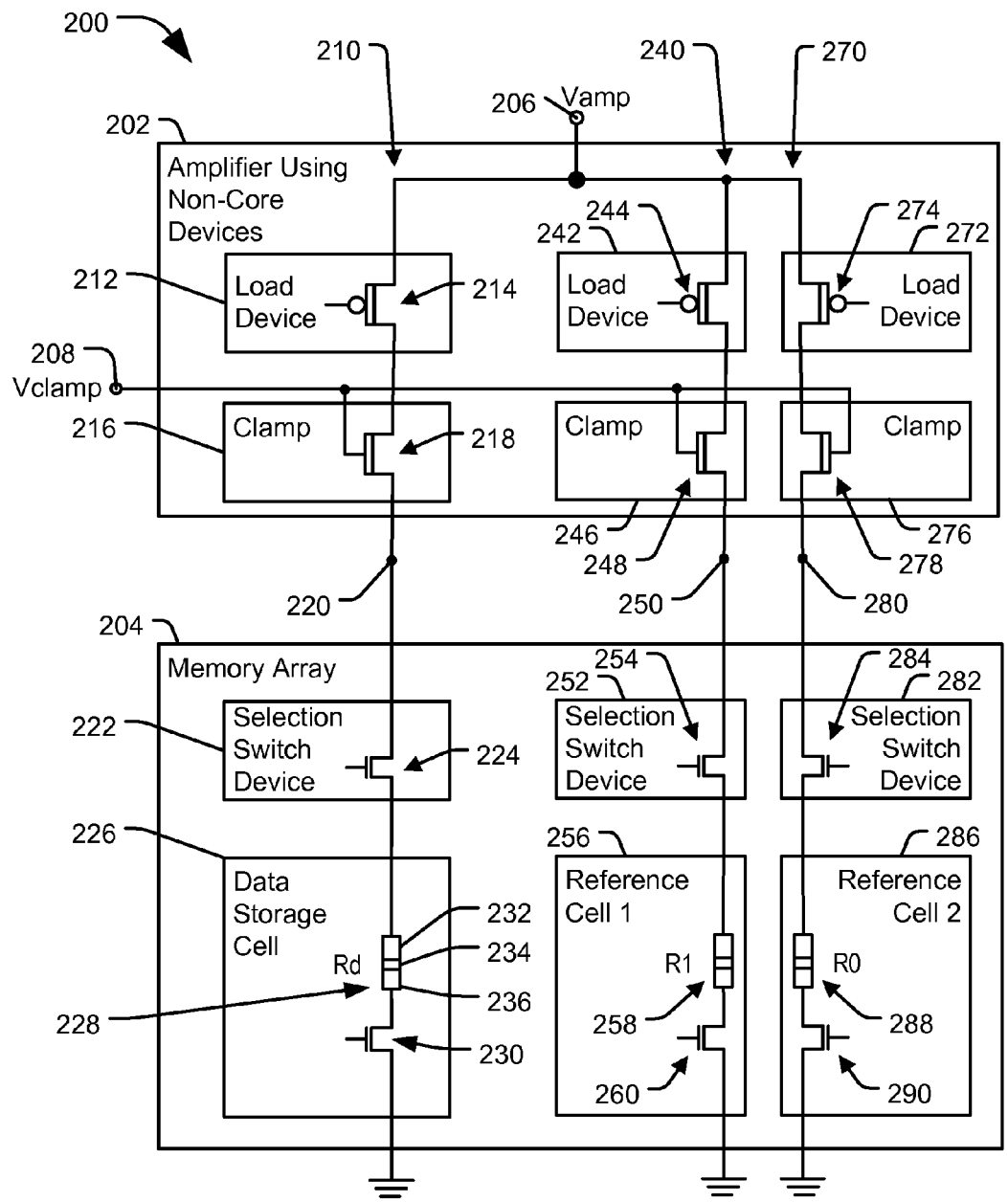
FIG. 2 is a diagram of a second illustrative embodiment of a memory device with an amplifier using a first type of device and a memory array using a second type of device.

Referring to FIG. 2, a diagram of a second illustrative embodiment of a memory device with an amplifier using a first type of device and a memory array using a second type of device is depicted and generally designated 200. In a particular embodiment, the memory device 200 operates substantially similarly to the memory device 100 illustrated in FIG. 1. The memory device 200 may include a memory (or data storage) cell 226 that may include a resistance-based memory element 228 coupled to an access transistor 230. The access transistor 230 may have a first oxide thickness to enable operation of the memory cell 226 at an operating voltage Vop. In a particular embodiment, the memory cell 226 may be a spin-transfer torque magnetoresistive random access memory (STT-MRAM) cell. The memory cell 226 may be included in a memory array 204. The memory device 200 may also include a first amplifier 202 configured to couple the memory cell 226 to a supply voltage Vamp at a supply terminal 206, where the supply voltage Vamp is greater than a voltage limit Vlimit, to generate a data signal based on a current through the memory cell 226. The first amplifier 202 may include a first clamp transistor 218 that has a second oxide thickness that is greater than the first oxide thickness of the access transistor 230. The clamp transistor 218 may be configured to prevent the operating voltage Vop at the memory cell 226 from exceeding the voltage limit Vlimit. By providing an appropriate clamp control voltage Vclamp at a control terminal 208 to protect the memory array 204 from voltages exceeding Vlimit, the memory array 204 may use smaller devices for higher density and smaller sizes. In addition, the first amplifier 202 may use more robust devices to enhance operation using a larger supply voltage Vamp.

In a particular embodiment, the access transistor 230 may have a core device configuration and the first clamp transistor 218 may have an input-output (IO) device configuration. In these particular embodiments, the first clamp transistor 218 may be configured to operate at an input-output (IO) supply voltage, Vamp, and the access transistor 230 may be configured to operate at a core supply voltage, Vcore. In these particular embodiments, the core supply voltage Vcore may be approximately 1V, and the IO supply voltage Vamp may be approximately 1.8V. In a particular embodiment, the access transistor 230 may have the core device configuration with the first oxide thickness in a range from about 1 nm to about 3 nm. In these particular embodiments, the first clamp transistor 218 may have the input-output (IO) device configuration with the second oxide thickness in a range from about 3.5 nm to about 10 nm.

A data read path 210 may include a first load device 212 that may include a first load transistor 214. In a particular embodiment, the first load transistor 214 may be a PMOS load transistor. The first load device 212 may be coupled to a first clamp device 216 that may include the first clamp transistor 218, where the first load transistor 214 may be coupled to the first clamp transistor 218. The first clamp transistor 218 may be coupled to the control terminal 208 that may be biased with the clamp voltage Vclamp. The first clamp device 216 may be coupled through a first node 220 to a first selection switch device 222 that may include a first MUX transistor 224, where the first clamp transistor 218 may be coupled to the first MUX transistor 224. The first selection switch device 222 may be included in the memory array 204. The first selection switch device 222 may be coupled to the memory cell 226, where the first MUX transistor 224 may be coupled to the access transistor 230 via the resistance-based memory element 228 having a resistance Rd. In a particular embodiment, the resistance-based memory element 228 may include a magnetic tunnel junction (MTJ) that may include a reference layer 232, a tunneling layer 234, and a free layer 236. The access transistor 230 may be coupled to ground.

A first reference path 240 may include a second load device 242 that may include a second load transistor 244. In a particular embodiment, the second load transistor 244 may be a PMOS load transistor. The second load device 242 may be coupled to a second clamp device 246 that may include a second clamp transistor 248, where the second load transistor 244 may be coupled to the second clamp transistor 248. The second clamp transistor 248 may be coupled to the control terminal 208 that may be biased with the clamp voltage Vclamp. The second clamp device 246 may be coupled through a second node 250 to a second selection switch device 252 that may include a second MUX transistor 254, where the second clamp transistor 248 may be coupled to the second MUX transistor 254. The second selection switch device 252 may be included in the memory array 204. The second selection switch device 252 may be coupled to a first reference cell 256, where the second MUX transistor 254 may be coupled to a first reference access transistor 260 via a first resistance-based reference element 258 having a resistance R1. In a particular embodiment, the resistance-based memory element 258 may include a magnetic tunnel junction (MTJ). The first reference access transistor 260 may be coupled to ground.

A second reference path 270 may include a third load device 272 that may include a third load transistor 274. In a particular embodiment, the third load transistor 274 may be a PMOS load transistor. The third load device 272 may be coupled to a third clamp device 276 that may include a third clamp transistor 278, where the third load transistor 274 may be coupled to the third clamp transistor 278. The third clamp transistor 278 may be coupled to the control terminal 208 that may be biased with the clamp voltage Vclamp. The third clamp device 276 may be coupled through a second node 280 to a third selection switch device 282 that may include a third MUX transistor 284, where the third clamp transistor 278 may be coupled to the third MUX transistor 284. The third selection switch device 282 may be included in the memory array 204. The third selection switch device 282 may be coupled to a second reference cell 286, where the third MUX transistor 284 may be coupled to a second reference access transistor 290 via a second resistance-based reference element 288 having a resistance R0. In a particular embodiment, the resistance-based memory element 288 may include a magnetic tunnel junction (MTJ). The second reference access transistor 290 may be coupled to ground.

The first amplifier 202 may include the first load transistor 214 coupled to the first clamp transistor 218 to generate the data signal. The first amplifier 202 may include the second load transistor 244 coupled to the second clamp transistor 248 and the third load transistor 274 coupled to the third clamp transistor 278. The second clamp transistor 248 and the third clamp transistor 278 may be configured to couple to the first reference cell 256 and to the second reference cell 286, respectively, to generate a reference signal. The first clamp transistor 218, the second clamp transistor 248, the third clamp transistor 278, the first load transistor 214, the second load transistor 244, and the third load transistor 274 may have an input-output (IO) device configuration. At least one transistor 230, 260, 290 of the memory cell 226, the first reference cell 256, and the second reference cell 286 may have a core device configuration. In a particular embodiment, the first MUX transistor 224, the second MUX transistor 254, and the third MUX transistor 284 may have the core device configuration.

As described above, the data read path 210 may include the first load device 212 coupled to the data storage cell 226 via the first clamp transistor 218. The first load device 212 may have a first device configuration to operate at a first supply voltage Vamp supplied at the supply terminal 206. In a particular embodiment, the first device configuration may be a non-core device configuration. In these particular embodiments, the first device configuration may be an input-output (IO) device configuration. The data storage cell 226 may include the access transistor 230 that may have a second device configuration to operate at an operating voltage Vop, at the node 220, that is not to exceed a voltage limit Vlimit that is less than the first supply voltage Vamp. In a particular embodiment, the second device configuration may be a core device configuration. In these particular embodiments, the core device configuration may have a smaller physical dimension than the non-core configuration. The control terminal 208 of the first clamp transistor 218 may be biased to prevent the voltage Vop at the data storage cell 226 from exceeding the voltage limit Vlimit. In a particular embodiment, the voltage limit Vlimit may be approximately 1V.

As described above, the first reference path 240 may include the second load device 242 coupled to the first reference cell 256 and the second reference path 270 may include the third load device 272 coupled to the second reference cell 286. The second load device 242 and the third load device 272 may have the first device configuration. The first reference cell 256 and the second reference cell 286 each may include at least one transistor 260, 290 that may have the second device configuration. The second clamp transistor 248 may prevent a second voltage at the first reference cell 256 from exceeding the voltage limit Vlimit. The third clamp transistor 278 may prevent a third voltage at the second reference cell 286 from exceeding the voltage limit Vlimit. The first selection switch device 222 in the data read path 210 may selectively couple the data storage cell 226 to the first clamp transistor 218. The second selection switch device 252 in the first reference path 240 may selectively couple the first reference cell 256 to the second clamp transistor 248. The third selection switch device 282 in the second reference path 270 may selectively couple the second reference cell 286 to the third clamp transistor 278. Each of the first selection switch device 222, the second selection switch device 252, and the third selection switch device 282 may have the second device configuration.

Figure 3:
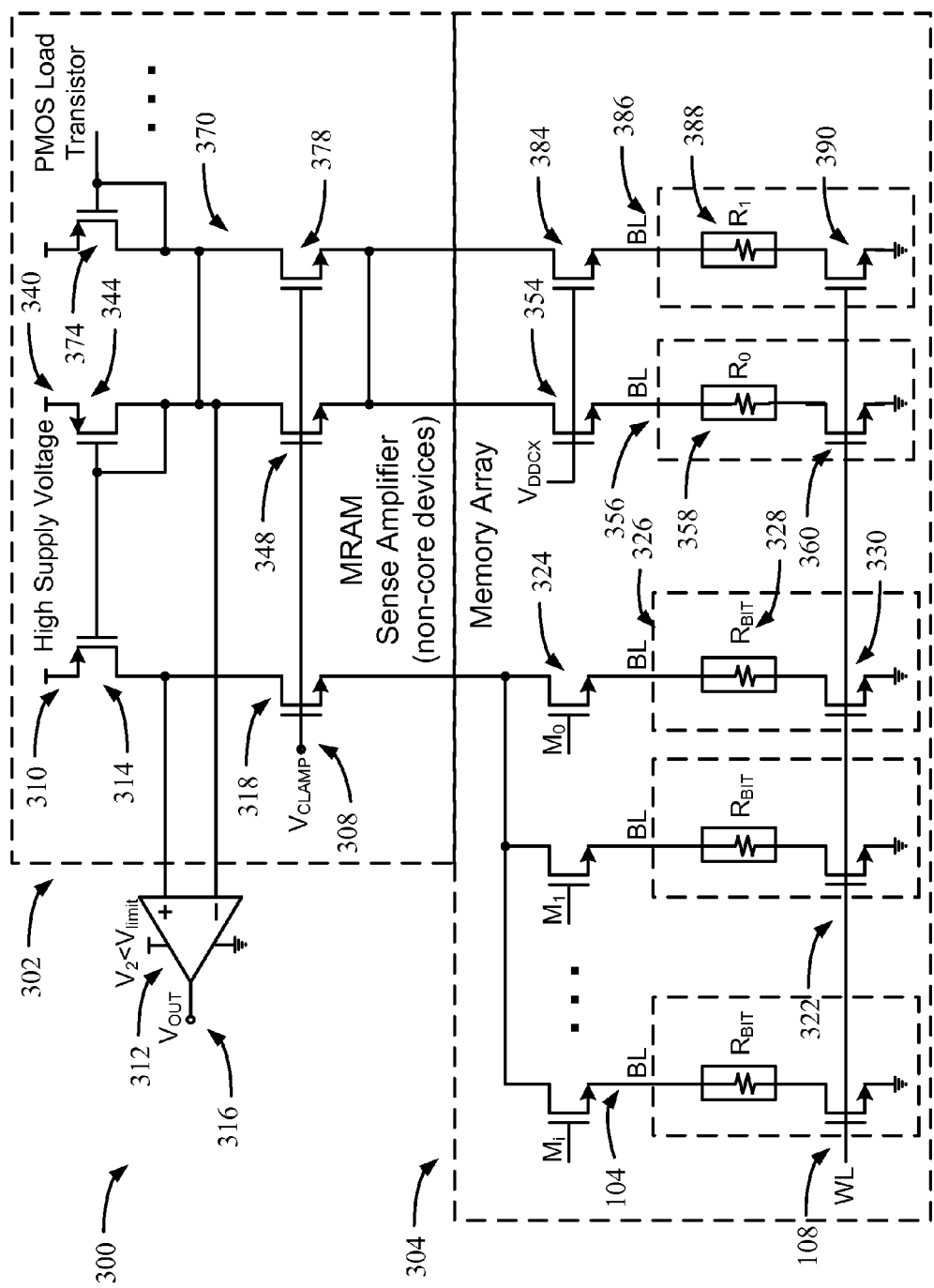
FIG. 3 is a diagram of a third illustrative embodiment of a memory device with an amplifier using a first type of device and a memory array using a second type of device.

Referring to FIG. 3, a diagram of a third illustrative embodiment of a memory device with an amplifier using a first type of device and a memory array using a second type of device is depicted and generally designated 300. In a particular embodiment, the memory device 300 operates substantially similarly to the memory device 100 illustrated in FIG. 1 and to the memory device 200 illustrated in FIG. 2. The memory device 300 may include a plurality of memory (or data storage) cells 326 that may each include a resistance-based memory element 328 coupled to an access transistor 330. The access transistor 330 may have a first oxide thickness to enable operation of the memory cells 326 at an operating voltage Vop. In a particular embodiment, the memory cells 326 may be spin-transfer torque magnetoresistive random access memory (STT-MRAM) cells. The memory cells 326 may be included in a memory array 304. The memory device 300 may also include a first amplifier stage 302 configured to couple the memory cells 326 to a high supply voltage Vamp, where the supply voltage Vamp is greater than a voltage limit Vlimit, to generate a data signal based on a current through one of the memory cells 326. The first amplifier stage 302 may include a first clamp transistor 318 that has a second oxide thickness that is greater than the first oxide thickness of the access transistor 330. The first clamp transistor 318 may be configured to prevent the operating voltage Vop at the memory cells 326 from exceeding the voltage limit Vlimit. In a particular embodiment, the first clamp transistor 318 may be an NMOS transistor having a non-core device configuration.

In a particular embodiment, the access transistor 330 may have a core device configuration and the first clamp transistor 318 may have an input-output (IO) device configuration. In these particular embodiments, the first clamp transistor 318 may be configured to operate at an input-output (IO) supply voltage, Vamp, and the access transistor 330 may be configured to operate at a core supply voltage, Vcore. In these particular embodiments, the core supply voltage Vcore may be within a range from about 0.9V to about 1.2V, such as approximately 1V, and the IO supply voltage Vamp may be within a range from about 1.5V to about 2.0V, such as approximately 1.8V.

The first amplifier stage 302 may be further configured to couple at least one reference cell 356, 386 to the supply voltage Vamp to generate a reference signal. The memory device 300 may include a second amplifier stage 312 coupled to the first amplifier stage 302. The second amplifier stage 312 may be configured to provide an output signal Vout at terminal 316 based on a difference between the data signal and the reference signal. The second amplifier stage 312 may include at least one transistor that has the first oxide thickness of the access transistors 330 and that is coupled to a second supply voltage V2 that does not exceed the voltage limit Vlimit.

The memory array 304 may include a plurality of MUX transistors 324, M0, M1, . . . , Mi, corresponding to the plurality of the memory cells 326 on the respective plurality of bit lines 104 (FIG. 1). In a particular embodiment, the MUX transistors 324 may be NMOS transistors having a core device configuration. Each of the plurality of MUX transistors 324, M0, M1, . . . , Mi, may couple a corresponding one of the plurality of the memory cells 326 to the first clamp transistor 318, providing one of a plurality of data read paths 310.

Each of the data read paths 310 may include a first load transistor 314. In a particular embodiment, the first load transistor 314 may be a PMOS load transistor. The first load transistor 314 may be coupled to the first clamp transistor 318. The first clamp transistor 318 may be coupled to a control terminal 308 that may be biased with a clamp voltage Vclamp. The first clamp transistor 318 may be coupled to the MUX transistors 324. The MUX transistors 324 may be coupled to the access transistors 330 via the resistance-based memory elements 328 of the corresponding memory cells 326. The resistance-based memory elements 328 may each include a magnetic tunnel junction (MTJ) illustrated as a resistance Rbit, which may include a logic "0" or logic "1" resistance value. The access transistors 330 may be coupled to ground. The gates of the access transistors 330 may be coupled to one of the plurality of word lines 108 (FIG. 1). In a particular embodiment, the access transistors 330 may be NMOS transistors having a core device configuration.

A first reference path 340 may include a second load transistor 344. In a particular embodiment, the second load transistor 344 may be a diode-connected PMOS load transistor. The second load transistor 344 may be coupled to a second clamp transistor 348. The second clamp transistor 348 may be coupled to the control terminal 308 that may be biased with the clamp voltage Vclamp. In a particular embodiment, the second clamp transistor 348 may be an NMOS transistor having a non-core device configuration. The second clamp transistor 348 may be coupled to a MUX transistor 354. The MUX transistor 354 may be included in the memory array 304. In a particular embodiment, the MUX transistor 354 may be an NMOS transistor having a core device configuration. The gate of the MUX transistor 354 may be coupled to a voltage supply having a voltage Vddcx that is less than a core device voltage limit. The MUX transistor 354 may be coupled to a first reference cell 356, where the MUX transistor 354 may be coupled to a first reference access transistor 360 via a first resistance-based reference element 358 having a resistance R0. In a particular embodiment, the resistance-based memory element 358 may include a magnetic tunnel junction (MTJ). The first reference access transistor 360 may be coupled to ground. The gate of the first reference access transistor 360 may be coupled to a word line 322, such as one of the plurality of word lines 108 depicted in FIG. 1. In a particular embodiment, the first reference access transistor 360 may be an NMOS transistor having a core device configuration.

A second reference path 370 may include a third load transistor 374. In a particular embodiment, the third load transistor 374 may be a PMOS load transistor. The third load transistor 274 may be coupled to a third clamp transistor 278. The third clamp transistor 278 may be coupled to the control terminal 208 that may be biased with the clamp voltage Vclamp. In a particular embodiment, the third clamp transistor 378 may be an NMOS transistor having a non-core device configuration. The third clamp transistor 278 may be coupled to a MUX transistor 384. The MUX transistor 384 may be included in the memory array 304. In a particular embodiment, the MUX transistor 384 may be an NMOS transistor having a core device configuration. The gate of the MUX transistor 384 may be coupled to the gate of the MUX transistor 354 and may also be coupled to a voltage supply having a voltage Vddcx. The MUX transistor 384 may be coupled to a second reference cell 386, where the MUX transistor 384 may be coupled to a second reference access transistor 390 via a second resistance-based reference element 388 having a resistance R1. In a particular embodiment, the resistance-based memory element 358 may include a magnetic tunnel junction (MTJ). The second reference access transistor 390 may be coupled to ground. The gate of the second reference access transistor 390 may be coupled to one of the plurality of word lines 108 (FIG. 1). In a particular embodiment, the second reference access transistor 390 may be an NMOS transistor having a core device configuration.

The first amplifier stage 302 may include the first load transistor 314 coupled to the first clamp transistor 318 to generate the data signal. The first amplifier stage 302 may include the second load transistor 344 coupled to the second clamp transistor 348 and the third load transistor 374 coupled to the third clamp transistor 378. The second clamp transistor 348 and the third clamp transistor 378 may be configured to couple to the first reference cell 356 and to the second reference cell 386, respectively, to generate the reference signal. The second amplifier stage 312 may be coupled to each of the read data paths 310, the first reference path 340, and the second reference path 370. The second amplifier stage 312 may be configured to provide an output signal Vout at terminal 316 based on a difference between the data signal and the reference signal. The first clamp transistor 318, the second clamp transistor 348, the third clamp transistor 378, the first load transistor 314, the second load transistor 344, and the third load transistor 374 may have an input-output (IO) device configuration. At least one of the transistors 330, 360, 390 of the memory cells 326, the first reference cell 356, and the second reference cell 386 may have a core device configuration. In a particular embodiment, the MUX transistors 324, the MUX transistor 354, and the MUX transistor 384 may have the core device configuration. The second amplifier stage 312 may include at least one transistor that has the core device configuration and that is coupled to the second supply voltage V2 that does not exceed the voltage limit Vlimit.

As described above, each of the data read paths 310 may include the first load transistor 314 coupled to the memory cells 326 via the first clamp transistor 318. The first load transistor 314 may have a first device configuration to operate at a first supply voltage Vamp. In a particular embodiment, the first device configuration may be a non-core device configuration. In these particular embodiments, the first device configuration may be an input-output (IO) device configuration. The memory cells 326 may include the access transistors 330 that may have a second device configuration to operate at an operating voltage Vop that is not to exceed a voltage limit Vlimit that is less than the first supply voltage Vamp. In a particular embodiment, the second device configuration may be a core device configuration. In these particular embodiments, the core device configuration may have a smaller physical dimension than the non-core configuration. The control terminal 308 of the first clamp transistor 318 may be biased to prevent the voltage Vop at the memory cells 326 from exceeding the voltage limit Vlimit. In a particular embodiment, the voltage limit Vlimit may be approximately 1V.

As described above, the first reference path 340 may include the second load transistor 344 coupled to the first reference cell 356 and the second reference path 370 may include the third load transistor 374 coupled to the second reference cell 386. The second load transistor 344 and the third load transistor 374 may have the first device configuration. The first reference cell 356 and the second reference cell 386 each may include at least one transistor 360, 390 that may have the second device configuration. The second clamp transistor 348 may prevent a second voltage at the first reference cell 356 from exceeding the voltage limit Vlimit. The third clamp transistor 378 may prevent a third voltage at the second reference cell 386 from exceeding the voltage limit Vlimit.

The MUX transistors 324 in the data read paths 310 may selectively couple the memory cells 326 to the first clamp transistor 318. The MUX transistor 354 in the first reference path 340 may be biased to couple the first reference cell 356 to the second clamp transistor 348. The MUX transistor 384 in the second reference path 370 may be biased to couple the second reference cell 386 to the third clamp transistor 378. Each of the MUX transistors 324, 354, 384 may have the second device configuration.

Figure 4:
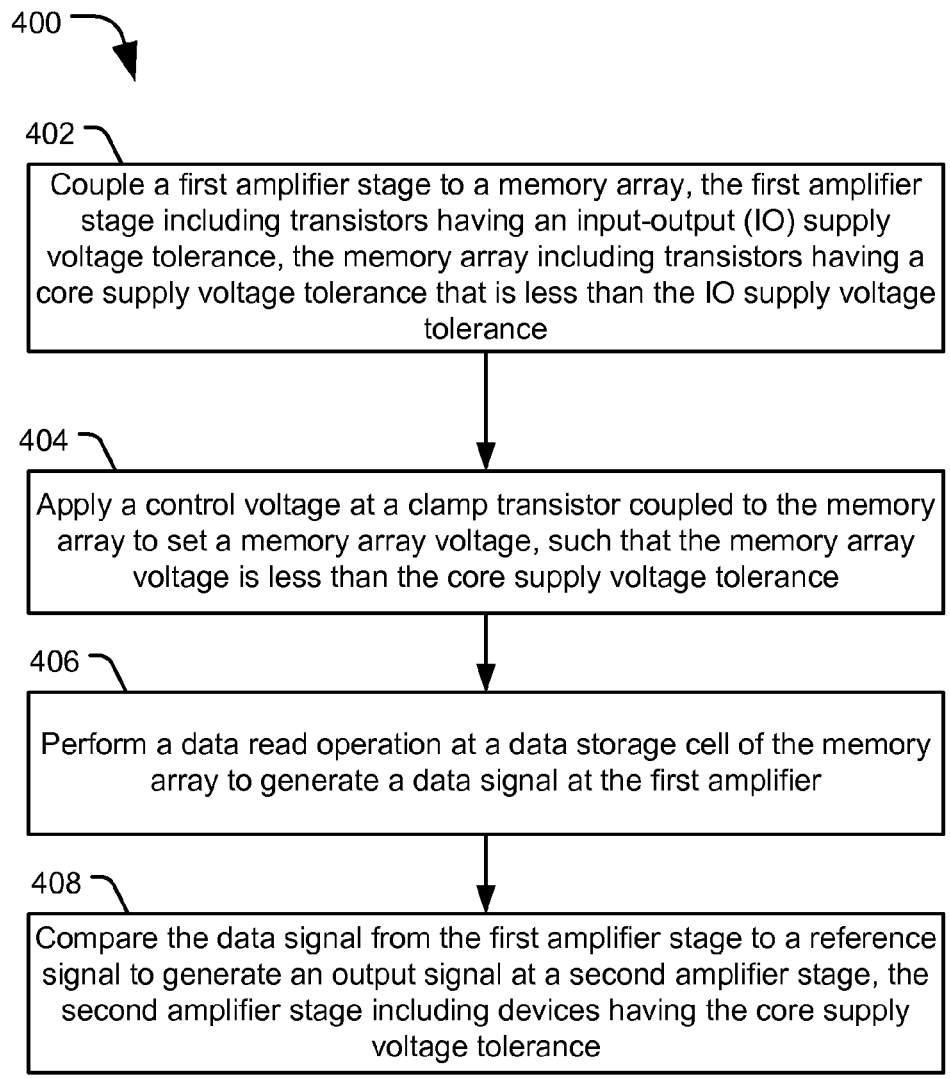
FIG. 4 is a flow diagram of a particular illustrative embodiment of a method of operating a memory device with an amplifier using a first type of device and a memory array using a second type of device.

Referring to FIG. 4, a flow diagram of a particular illustrative embodiment of a method of operating a memory device with an amplifier using a first type of device and a memory array using a second type of device is depicted and generally designated 400. At 402, a first amplifier stage may be coupled to a memory array. The first amplifier stage may include transistors having an input-output (IO) supply voltage tolerance. The memory array may include transistors having a core supply voltage tolerance that is less than the IO supply voltage tolerance. In a particular embodiment, the first amplifier stage may be the amplifier 112 and the memory array may be the memory array 102 of FIG. 1. In another particular embodiment, the first amplifier stage may be the first amplifier 202 and the memory array may be the memory array 204 of FIG. 2. In another particular embodiment, the first amplifier stage may be the first amplifier stage 302 and the memory array may be the memory array 304 of FIG. 3.

Continuing to 404, a control voltage may be applied at a clamp transistor coupled to the memory array to set a memory array voltage, such that the memory array voltage is less than the core supply voltage tolerance. For example, the control voltage Vclamp may be applied at the clamp transistors 218, 248, and 278 coupled to the memory array 204 to set the voltage at the nodes 220, 250, and 280 such that the memory array voltage is less than the core supply voltage tolerance, such as illustrated in FIG. 2. In a particular embodiment, the control voltage Vclamp may be applied at a clamp transistor 318, 348, 378 coupled to the memory array 304 to set a memory array voltage Vop (FIG. 1) such that the memory array voltage Vop is less than the core supply voltage tolerance Vlimit, such as illustrated in FIG. 3. One consequence of not controlling Vclamp is that the memory array voltage may exceed the core supply voltage tolerance causing the core devices in the memory array to fail.

Moving to 406, a data read operation may be performed at a data storage cell of the memory array to generate a data signal at the first amplifier. In a particular embodiment, the data read operation may be performed at a data storage cell 226 of the memory array 204 to generate a data signal at the first amplifier 202 using the read data path 210, such as illustrated in FIG. 2. In a particular embodiment, the data read operation may be performed at one of the memory cells 326 of the memory array 304 to generate a data signal at the first amplifier stage 302 using one of the read data paths 310, such as illustrated in FIG. 3.

Advancing to 408, the data signal from the first amplifier stage may be compared to a reference signal to generate an output signal at a second amplifier stage. The second amplifier stage may include devices having the core supply voltage tolerance. In a particular embodiment, the data signal from the first amplifier stage 302 may be compared to a reference signal to generate an output signal Vout at the second amplifier stage 312, the reference signal being generated using the first reference path 340 and the second reference path 370, such as illustrated in FIG. 3. In a particular embodiment, the second amplifier stage 312 may include devices having the core supply voltage tolerance, such as illustrated in FIG. 3.

In a particular embodiment, the data storage cell may be coupled to the first clamp transistor via a selection transistor to enable a current flow from a voltage supply of the first amplifier through the data storage cell. For example, the data storage cell 226 may be coupled to the first clamp transistor 218 via a selection transistor such as the first MUX transistor 224 to enable a current flow from the voltage supply 206 of the first amplifier 202 through the data storage cell 226, such as illustrated in FIG. 2. As another example, one of the memory cells 326 may be coupled to the first clamp transistor 318 via a selection transistor such as a respective one of the MUX transistors 324 to enable a current flow from the voltage supply of the first amplifier stage 302 through the corresponding one of the memory cells 326, such as illustrated in FIG. 3. In these particular embodiments, the selection transistor such as the first MUX transistor 224 and/or the MUX transistors 324 may have the core supply voltage tolerance Vlimit. In these particular embodiments, increasing the voltage supply Vamp of the first amplifier 202 and/or the first amplifier stage 302 increases a read margin of the data read operation.

Those of skill would further appreciate that the various illustrative logical blocks, configurations, modules, circuits, and algorithm steps described in connection with the embodiments disclosed herein may be implemented as electronic hardware, computer software, or combinations of both. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disk read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:
1. A memory device, comprising:
 a memory cell including a resistance-based memory element coupled to an access transistor, the access transistor having a first oxide thickness to enable operation of the memory cell at an operating voltage; and a first amplifier configured to couple the memory cell to a supply voltage that is greater than a voltage limit to generate a data signal based on a current through the memory cell, wherein the first amplifier includes a clamp transistor that has a second oxide thickness that is greater than the first oxide thickness, and wherein the clamp transistor is configured to prevent the operating voltage at the memory cell from exceeding the voltage limit.

2. The memory device of claim 1, wherein the access transistor has a core device configuration and wherein the clamp transistor has an input-output (IO) device configuration.

3. The memory device of claim 2, wherein the clamp transistor is configured to operate at an input-output (IO) supply voltage, and wherein the access transistor is configured to operate at a core supply voltage.

4. The memory device of claim 3, wherein the core supply voltage is approximately 1 volt, and wherein the IO supply voltage is approximately 1.8 volts.

5. The memory device of claim 1, wherein the memory cell is a spin-transfer torque magnetoresistive random access memory (STT-MRAM) cell.

6. The memory device of claim 1, wherein the first amplifier is further configured to couple at least one reference cell to the supply voltage to generate a reference signal, and further comprising:

a second amplifier coupled to the first amplifier and configured to provide an output signal based on a difference between the data signal and the reference signal, the second amplifier including at least one transistor that has the first oxide thickness and that is coupled to a second supply voltage that does not exceed the voltage limit.

7. The memory device of claim 1, wherein the first amplifier further comprises:

a first load transistor coupled to the clamp transistor to generate the data signal;

a second load transistor coupled to a second clamp transistor; and a third load transistor coupled to a third clamp transistor, wherein the second clamp transistor and the third clamp transistor are configured to couple to a first reference cell and to a second reference cell to generate a reference signal, wherein the first clamp transistor, the second clamp transistor, the third clamp transistor, the first load transistor, the second load transistor, and the third load transistor have an input-output (IO) device configuration and wherein at least one transistor of each of the memory cell, the first reference cell, and the second reference cell has a core device configuration.

* * * * *